United States Patent [19]
Dyke

[11] Patent Number: 5,872,468
[45] Date of Patent: Feb. 16, 1999

[54] LEVEL DETECTOR CIRCUIT, INTERFACE AND METHOD FOR INTERPRETING AND PROCESSING MULTI-LEVEL SIGNALS

[75] Inventor: Peter J. Dyke, Widdington, United Kingdom

[73] Assignee: Northern Telecom Limited, Montreal, Canada

[21] Appl. No.: 873,936

[22] Filed: Jun. 12, 1997

[51] Int. Cl.[6] .................................................. H03K 5/153
[52] U.S. Cl. .............................. 327/72; 327/60; 327/68; 327/333; 327/336
[58] Field of Search ................................ 327/60, 61, 63, 327/64, 65, 68, 69, 70, 71, 72, 90, 319, 333, 336

[56] References Cited

U.S. PATENT DOCUMENTS 5,120,995  6/1992  Abdi ........................................... 327/61

FOREIGN PATENT DOCUMENTS

| 1427811 | 4/1973 | United Kingdom . |
| 2045580 | 3/1979 | United Kingdom . |
| 2030818 | 8/1979 | United Kingdom . |
| 2288089 | 3/1994 | United Kingdom . |
| 2293931 | 10/1994 | United Kingdom . |
| WO 93/26110 A1 | 6/1993 | WIPO . |

OTHER PUBLICATIONS

G703 Interface Port Specification.
Exar, XR–T5640 LSI design specification for PCM AMI Line Receiver and Clock Recovery Circuit.

*Primary Examiner*—Timothy P. Callahan
*Assistant Examiner*—Jeffrey Zweizig
*Attorney, Agent, or Firm*—John D. Crane

[57] ABSTRACT

To decode an attenuated multi-level signal (42) in a receive interface (120) of communication apparatus, first (134) and second (150) diode pumps co-operate with a biasing chain to ensure that threshold reference levels used by respective positive (52) and negative (54) data comparators are dynamically adjusted to a level dependent upon the attenuated multi-level signal (42) applied to the diode pumps. Particularly, a voltage divider (138–144) acts dynamically to bias differential inputs to the respective positive (52) and negative (54) data comparators, with a ratio between a biasing chain of resistors (138–144) and a common input resistor 128 determining the threshold reference levels used to assign logical levels for the reconstruction of symbols encoded within the multi-level signal (42).

12 Claims, 5 Drawing Sheets

LEVEL DETECTOR CIRCUIT, INTERFACE AND METHOD FOR INTERPRETING AND PROCESSING MULTI-LEVEL SIGNALS

BACKGROUND TO THE INVENTION

This invention relates, in general, to a level detector circuit and interface for interpreting and processing multi-level signals and is particularly, but not exclusively, applicable to setting reference level thresholds in a detector used in line interfaces of telecommunication systems.

SUMMARY OF THE PRIOR ART

Modern telecommunication systems are structured to allow the routing of information to many forms of communication device. For example, cellular radiotelephones may communicate with landline telephones or value-added service providers, with an interconnection between these devices facilitated by some form of network. The network typically has a hardwired, receive interface (usually termed an "input port") that interconnects at a data rate of 2 Mega-bits per second (Mbps), although higher and lower data rates are supported by differing telecommunication standards. Each network connection may therefore comprise one or more receive interfaces that together support a multiplicity of traffic and data channels. The receive interface may also be implemented in a number of forms, such as a multiplexer, a switch or some other configuration that supports plesiochronous digital hierarchies (PDH) or synchronous digital hierarchies (SDH).

An input signal for a 2 Mbps CCITT standard G703 interface, for example, is a bipolar (3-level) signal having a nominal 2.37 volts (V) peak. Unfortunately, like all other forms of transmission, a 3-level signal is attenuated by both the physical channel over which it was sent and in-station cabling, i.e. transmission losses resulting from the transmission properties of the paths and physical interconnects. Indeed, the CCITT standard actually allows in-station attenuation of the signal by up to 6 decibels (dB). It is therefore necessary to locate accurately and then to sample accurately a portion of a received waveform; this being accomplished by pinpointing, in time, reference levels within each "eye" of the waveform. More particularly, in the prior art, the attenuated input waveform is amplified in an intelligent fashion to produce an intermediate encoded signal having a compensated voltage proportional to fixed operating voltage of a peak, average or root-mean-square (rms) detector. The peak detector further includes a predetermined reference threshold against which the voltage-compensated encoded signal is compared to decode and eventually retrieve the original encoded information. As such, a prior art receive interface includes both an automatic gain control (AGC) or an automatic line build-out (ALBO) circuit arranged to regulate amplification of an original input signal and a clock extraction circuit.

To date, receive interfaces have been built on custom-designed, analog large scale integrated circuits (LSI), but such LSIs, however, are expensive in terms of manufacturing cost, the amount of power they consume (and hence the amount of heat they generate) and even their physical size. More particularly, large numbers of transistors are required to implement the detection and tracking of the reference levels, particularly in relation to the control of the requisite amplification by the AGC or ALBO circuit.

It would therefore be desirable to produce a simplified receive interface that addresses at least some of the foregoing problems and deficiencies.

SUMMARY OF THE INVENTION

According to a first aspect of the present invention there is provided a level detector circuit arranged to assign into logical levels a multi-level signal having varying amplitudes, the level detector circuit comprising: a) a comparator having: a first input responsive to the multi-level signal; a second input arranged to receive a reference level threshold having a reference amplitude; and an output, responsive to said first input and said second input, for providing the logical levels based upon relative amplitudes between the multi-level signal and the reference level threshold; and b) a control circuit responsive to the multi-level signal and having an output arranged to generate the reference level threshold, the control circuit having means for dynamically varying said reference amplitude of the reference level threshold in proportion to the amplitude of the multi-level signal.

In a preferred embodiment, a biasing chain of a voltage divider network is coupled to an integrator for weighting said reference amplitude of the reference level threshold in proportion to an amplitude of the multi-level signals. Particularly, the biasing chain may comprise a first resistive network having a first resistance and a second resistive network having a second resistance, wherein weighting of said reference amplitude of the reference level threshold is based upon a ratio between said second resistance and said first resistance.

In a second aspect of the present invention there is provided an interface for a communication device responsive to an attenuated bipolar signal having symbols represented by information bits of varying amplitudes, the interface comprising a plurality of level detector circuits arranged to assign the bipolar signal into logical levels, each one of the plurality of level detector circuits having: a) a comparator having: a first input responsive to the bipolar signal; a second input arranged to receive a reference level threshold having a reference amplitude; and an output, responsive to said first input and said second input, for providing the logical levels for the symbols based upon relative amplitudes between the bipolar signal and the reference level threshold; and b) a control circuit responsive to the bipolar signal and having an output arranged to generate the reference level threshold, the control circuit having means for dynamically varying said reference amplitude of the reference level threshold in proportion to the amplitude of the bipolar signal.

In another aspect of the present invention there is provided a method of adjusting a logical output of a level detector circuit arranged to assign into logical levels a multi-level signal having varying amplitudes, the level detector circuit comprising a comparator having a first input, a second input and an output, the level detector circuit further comprising a control circuit responsive to the multi-level signal and having an output arranged to generate a reference level threshold having a reference amplitude, the method comprising the steps of: applying the multi-level signal to the first input; applying the reference level threshold to the second input; generating logical levels at the output based upon relative amplitudes between the multi-level signal applied to the first input and the reference amplitude; and dynamically varying said reference amplitude of the reference level threshold in proportion to the amplitude of the multi-level signal applied to the first input.

The step of dynamically varying said reference amplitude may further include the steps of: integrating the multi-level signals to provide an integrated signal; and weighting said integrated signal to adjust the reference amplitude of the reference level threshold in proportion to the amplitude of the multi-level signals.

Advantageously, the present invention therefore provides a simplified receive interface for a communications device, which interface operates to adapt continuously and dynamically, in proportion to the amplitude of the multi-level signal, a reference amplitude of a reference level threshold used in a level detector.

BRIEF DESCRIPTION OF THE DRAWINGS

An exemplary embodiment of the present invention will now be described with reference to the accompanying drawings, in which.

DETAILED DESCRIPTION OF A PREFERRED EMBODIMENT

Figure 1:
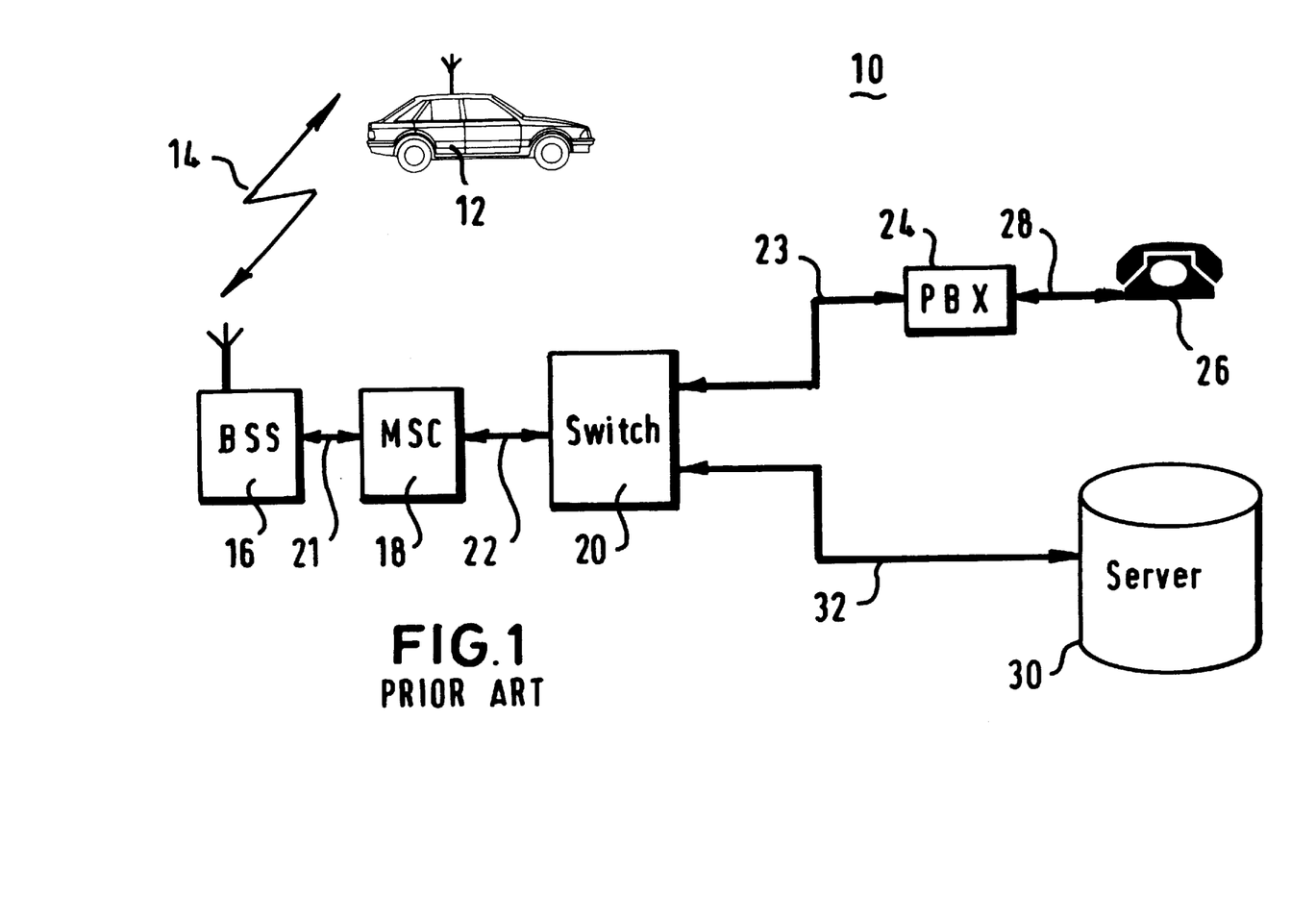
FIG. 1 is a block diagram illustrating interconnection of prior art communication systems.

FIG. 1 illustrates the exemplary interconnection of a prior art communication system 10. The communication system 10, for the sake of illustration and brevity only, comprises three distinct networks. A cellular radiotelephone network comprising a mobile subscriber unit 12 in radio communication, over a communication resource 14, with a base station sub-system (BSS) 16. The BSS 16 is coupled to a mobile switching centre (MSC) 18, which in turn is coupled to a switch 20. The BSS 16, MSC 18 and switch 20 are interconnected by a 2 Mbps E1 link 21–22, and so each piece of infrastructure requires at least one receive interface or receive port. A second network connected to the switch 20 is a private branch exchange (PBX) 24. The PBX 24 is further coupled to a plurality of landline subscriber units (only one landline telephone 26 is shown in detail). Again, the PBX 24 is connected to the switch 20 by a 2 Mbps E1 link 23 (or the like), while the telephone 26 is typically connected to the PBX by a twisted pair 28. A third portion of the communication network 10 comprises a network server 30 providing ancillary services to the communication system 10. Again, the network server 30 is connected to the switch 20 by a 2 Mbps E1 link 32 (or the like).

Figure 2:
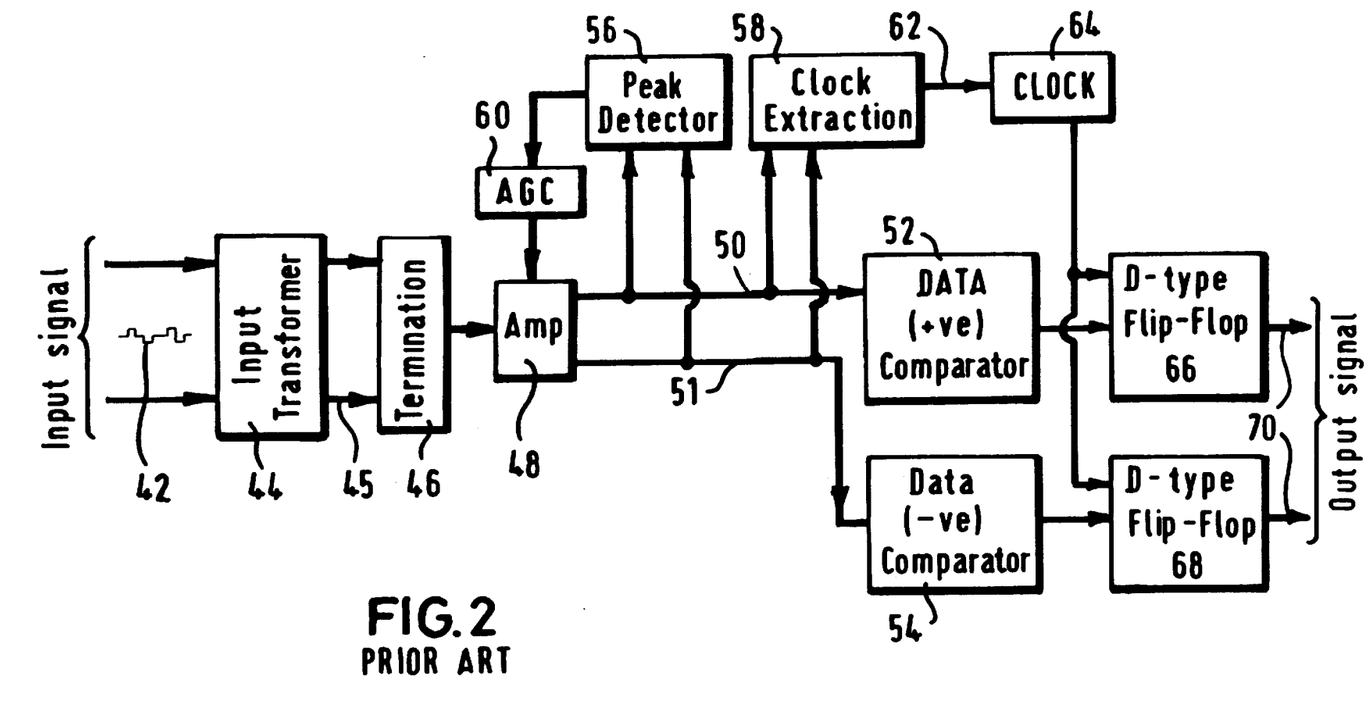
FIG. 2 is a block diagram of a prior art receive interface.

Turning now to FIG. 2, in which there is shown a block diagram of a prior art receive interface circuit 40. By way of explanation only, the receiver interface circuit 40 will be described with respect to a bipolar input signal 42.

An input transformer 44, typically having a centre tap on the primary and/or secondary windings (not shown), is responsive to the bipolar input signal 42. Typically, the numbers of windings on the primary and secondary coils are identical, and so no amplification of the (attenuated) bipolar input signal 42 occurs. As will be appreciated, the transformer 44 is the conventional method for providing isolation from the in-station cabling. After passing through the transformer, resistive termination of the resultant bipolar signal 45 occurs at termination block 46 to terminate the in-station cabling, typically with a 75 Ohm (n) load. After termination, the bipolar signal 45 must necessarily be amplified by amplifier 48 to produce two encoded output signals 50–51 for respective input to positive data (+ve) comparator 52 and negative (–ve) data comparator 54. The positive data (+ve) comparator 52 and negative (–ve) data comparator 54 act as level detectors and therefore assign logical values to different portions of the varying bipolar input signal 42.

Conventionally, a centre tap is required on the secondary windings of the transformer to provide a voltage bias point for the receive circuitry in the interface. The centre tap also provides a signal earthing point that allows positive (+ve) and negative (–ve) received pulses to be fed into amplifier 48 (which is normally balanced for the sake of simplifying LSI design and manufacture, as will be understood).

Each of the encoded output signals 50–51, prior to input to the respective data comparators 52–54, typically also provides pairs of inputs to a peak detector 56 and clock extraction comparators 58. As will be appreciated, the peak detector 56 could be implemented as an average or rms detector, while the AGC could be an ALBO. An automatic gain control circuit 60 is responsive to an output from the peak detector 56, while an output from the AGC 60 is coupled to the amplifier 48 for control of the amplification process, as will be readily understood. As previously stated, the encoded output signals 50–51 have both been amplified relative to a fixed operating (voltage) level of the positive and negative data comparators 52–54. In accordance with known techniques, the clock extraction comparators 58 extract appropriate timing (or clock) information from the bipolar input signal 42, and also provide a periodic time signal 62 for use by clock timing circuit 64 to regulate accurately the timing of first storage element 66 and second storage element 68. Typically, first and second storage elements are implemented as D-type flip-flops, and are arranged to store output values respectively sourced from outputs of positive data comparator 52 and negative data comparator 54. Often, the clock 64 is comprised from an analog tank- circuit made from a parallel combination of an inductor and a capacitor.

The positive and negative data comparators 52–54 function as level detectors to analyse the attenuated and amplified bipolar signal (i.e. the encoded output signals 50–51) by comparing a level of each encoded output signals against pre-assigned (and set) reference threshold values indicative of logical 0 and logical ±1, as will be described subsequently. Once a level for the encoded output signals 50–51 has been determined and clocked into the respective storage elements 66–68, an output 70 can then be read from the corresponding storage element at the relevant time. Therefore, the prior art circuit functions by amplifying the bipolar input signal 42 to a level in proportion to the operating (voltage) level of the peak detectors, and then compares this amplified signal to the fixed threshold levels set within the peak detectors to identify the logical values encoded within the bipolar input signal 42.

Figure 3:
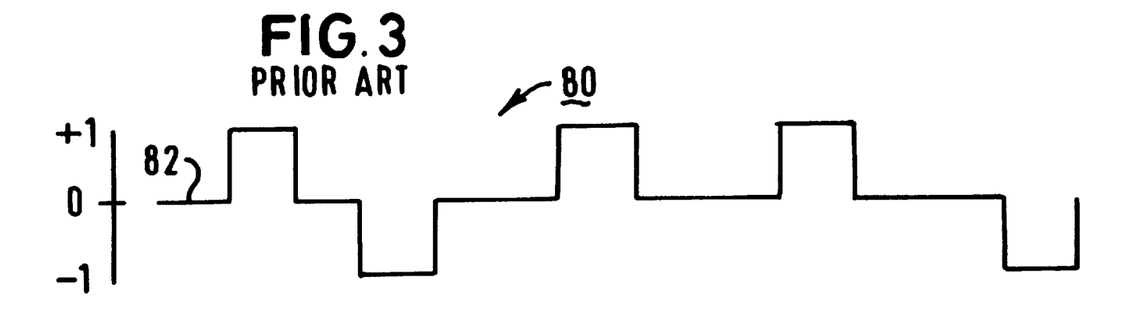
FIG. 3 is a waveform diagram of a conventional (ideal) 3-level signal.

FIG. 3 is a waveform diagram of a conventional (ideal) 3-level signal 80. The 3-level signal has a square wave profile (typically comprised of half-width or full width pulses), and can be seen to vary in amplitude between values of ±1 (with a logical 0 datum 82 at the mean level, i.e. the midpoint between ±1).

Figure 4:
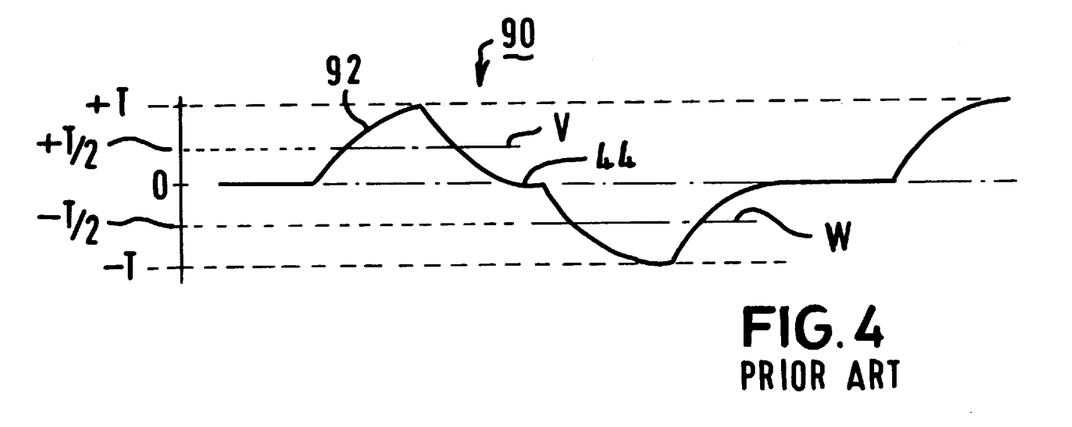
FIG. 4 is a waveform diagram of an attenuated 3-level signal.

FIG. 4 is a waveform diagram 90 of an attenuated 3-level signal (of FIG. 3). Rather than discussing a voltage transition of the 3-level signal between ±1 V (corresponding to logical ±1), this diagram represents the transition between logical values in a more generic form of ±T. Attenuation of the ideal 3-level signal 80, e.g. by in-station cabling, causes the square wave profile to become dispersed or distorted and to take on an arc-like appearance 92–94. More explicitly, as a logical value approaches either limit of ±T, a rate at which the limit is approached decreases. A similar phenomenon occurs when logical 0 is approached from either of the outer limits of logical ±T. As can be seen in the waveform diagram, the effects of the attenuation cause the signal profile to resemble a plurality of contiguous eye-shaped pulses, and it is therefore necessary for the positive and negative data comparators 52–54 to differentiate between logical levels (which do not have discrete transitions therebetween). In this respect, a level of approximately ±T/2 is used to identify a more appropriate position for operating the positive and negative data comparators 52–54 of FIG. 2, and this value of ±T/2 is fixedly pre-programmed into the positive and negative data comparators 52–54 as the respective reference levels.

The ±T/2 levels have been labelled as levels "v" and "w", respectively, and these labels will be used later to describe the circuit of the preferred embodiment.

Any value occurring above +T/2 is considered a logical +1, any value falling below –T/2 is considered a logical –1, and any value falling in between ±T/2 is logical 0. It will however be appreciated that the midpoint between a logical 0 and ±T transition (for a 3-level signal under normal conditions of cross-talk interference) actually occurs at a height of 46% of the limit, and that it is therefore desirable to set the reference thresholds at these optimum values.

Figure 5:
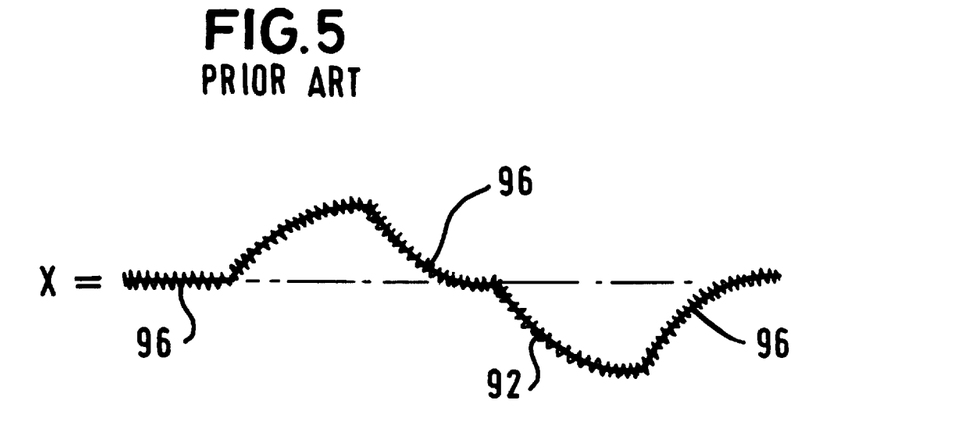
FIG. 5 illustrates the superposition and effect of interference on the waveform of FIG. 4.

The effects of interference, such as noise, further complicates the decoding of the 3-level signal; this is shown in FIG. 5. Particularly, the superposition and effect of interference 96 on the waveform of FIG. 4 can be seen to distort the crisp edge of the received 3-level signal; noise 96 appears as small perturbations along the overall signal profile and therefore introduces additional uncertainty in relation to any logical determination. The resultant attenuated and interference-effected 3-level signal has a signal profile labelled "x".

Figure 6:
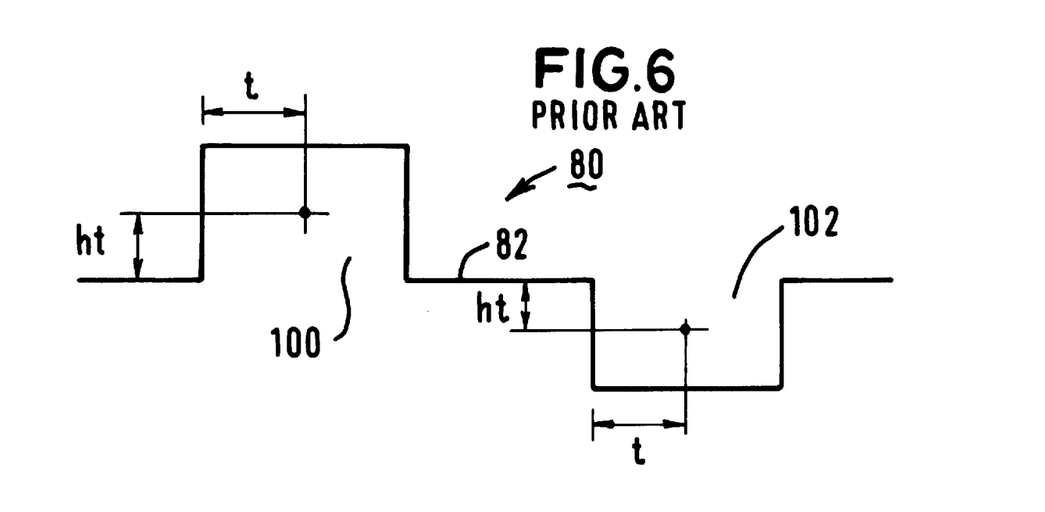
FIG. 6 illustrates an optimal level and timing detection mechanism of the prior art.

Referring to FIG. 6, an optimal level and timing detection mechanism for the prior art is illustrated. For the sake of clarity, the diagram shows an ideal (non-distorted) bipolar signal 80 with a logical 0 datum 82. In relation to the datum 82, and considering the square wave signal profile as separate pulses 100–102, the clock extraction comparators 58, the clock circuit 64 and the positive and negative data comparators 52–54 respectively ensure that each pulse 100–102 is sampled at a mid-time interval, t, from the edge of each pulse 100–102 and at a given signal level, ht. Again, in the prior art receive interface, the peak detector 56, AGC 60 and amplifier 48 ensure that the (voltage) level of the bipolar input signal 42 is appropriately weighted relative to the operating voltage of the positive and negative data comparators 52–54 (and hence relative to the pre-assigned threshold values of ±ht).

Figure 7:
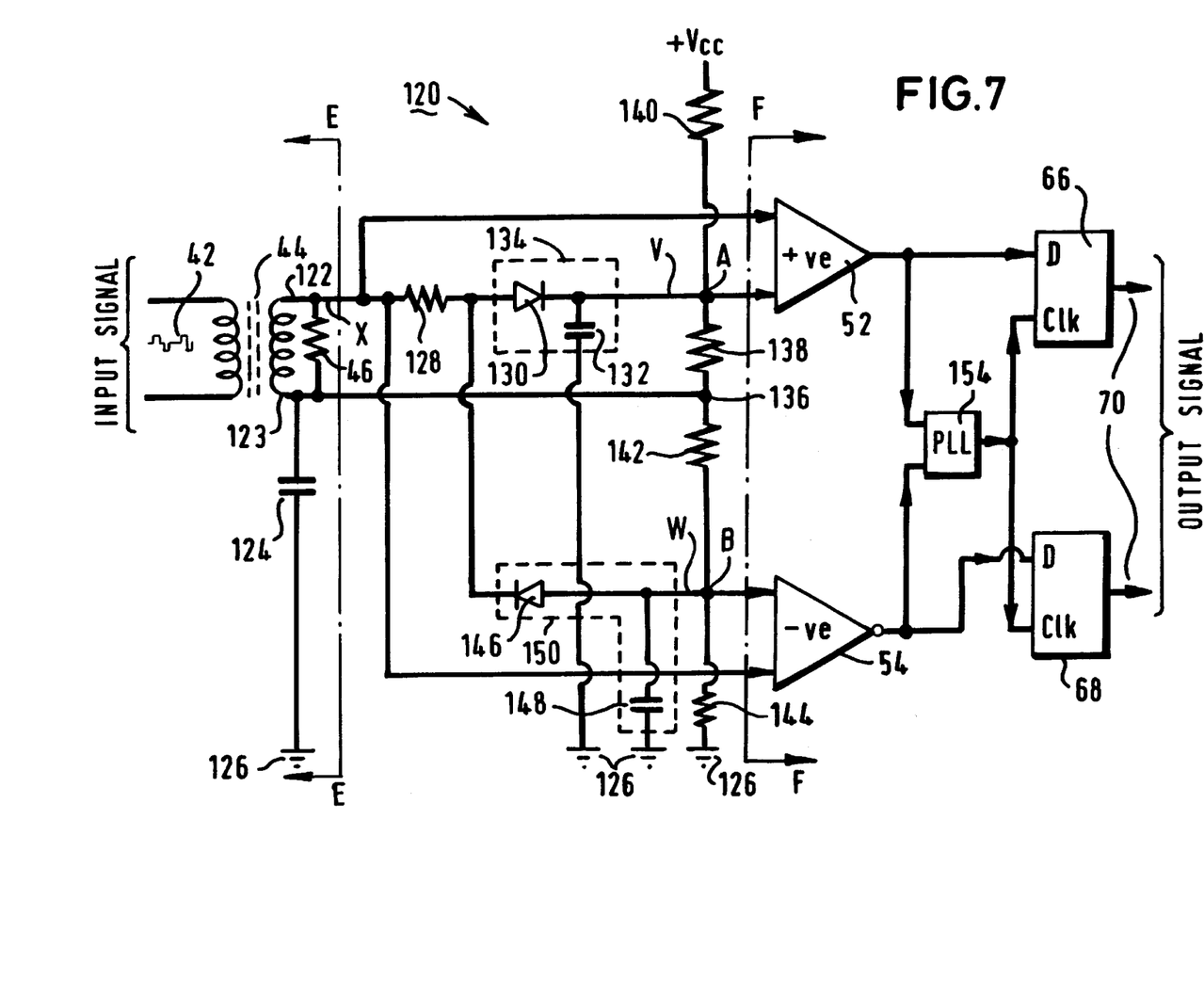
FIG. 7 shows a receive interface constructed according to a preferred embodiment of the present invention.

The present invention has identified that the input signal, even in its attenuated form, has adequate voltage, power and information to operate a detector circuit without any external power, amplification or extensive control processing being required. Hence, it is possible to dispense with the functions performed by the amplifier, the AGC and the peak detectors, i.e. those circuits required to compensate the input signal to a fixed voltage appropriate for processing by the fixed input peak detectors. In addition, the clock extraction comparators can be replaced by a digital phase lock loop (PLL), as will be understood. Consequently, the functionality of a (2 Mbps) receive interface circuit is significantly reduced to a point where most of the front-end circuitry is designed from discrete, passive components, namely resistors, diodes and capacitors. FIG. 7 shows a receive interface 120 constructed according to a preferred embodiment of the present invention. To facilitate identification of the present invention, components within the receive interface 120 that are common with the prior art architecture of FIG. 2 (and have also been previously described) share a common numbering scheme.

By way of explanation only, the receiver interface circuit 120 will be described with respect to a bipolar input signal 42. An input transformer 44 is responsive to the bipolar input signal 42, although the use of a centre-tap is no longer required in the implementation of the preferred embodiment of the present invention. Typically, the numbers of windings on the primary and secondary coils are identical, and so no amplification of the (attenuated) bipolar input signal 42 occurs. As will be appreciated, the transformer 44 is the conventional method for providing isolation from the in-station cabling. After passing through the transformer, termination of the resultant bipolar signal 45 occurs at a 75 Ohm (Ω) resistor 46 placed across first 122 and second 123 output terminals of the transformer 44. A de-coupling capacitor 124 is coupled between the second output terminal 123 (of the transformer 44) and a ground plane 126. The first output terminal 122 presents the waveform profile x (of FIG. 5) to the succeeding stages of the receive interface 120.

A positive (+ve) data comparator 52 receives, as a first input, the waveform profile x from the first output terminal 122 (of the transformer 44). A second (differential) input to the positive data comparator 52 is provided from modification (processing) of the waveform profile x by a series combination of a 620 Ω common input resistor 128 and a first diode 130. The anode of the first diode is connected to the common input resistor 128, while its cathode is coupled to the second input of the positive data comparator 52. A first capacitor 132, of capacitance 0.1 micro-Farads ($\mu$F) and located between the cathode of the first diode 130 and the second input of the positive data comparator 52, is coupled to the ground plane 126. The second output terminal 123 (of the transformer 44) is coupled in series through a circuit node 136 and a first resistor 138 of resistance 5.6 kilo-Ohms (kΩ) to the second input of the positive data comparator 52. With particular regard to the circuit connections of the first resistor 136, one end of the first resistor 138 is coupled to the circuit node 136 (as previously stated), while the other end is coupled both to the second input of the positive data comparator 52 and the cathode of the first diode 130. A supply voltage $V_{cc}$, typically 5 V, is provided to the receive interface 120 via a second resistor 140 of resistance 20 kΩ. More particularly, the second resistor 140 is coupled between the supply voltage $V_{cc}$ and the cathode of the first diode 130. The circuit node 136 is also coupled to the ground plane 126 via a series combination of a third resistor 142 of resistance 5.6 kG and a fourth resistor 144 of resistance 20 kΩ.

In other words, a voltage dividing or biasing chain is formed by resistors 138–144 from the 5 V supply ($V_{cc}$) at the top of resistor 140 to ground at the bottom of resistor 144, with the biasing chain arranged to bias comparators 52–54 in their normal operating modes. Particularly, circuit node 136 is arranged to have a voltage level of, typically, half the supply voltage, with points v and w having voltages slightly higher and lower, respectively. Therefore, in the absence of an input signal 42, comparator 52–54 are switched off.

A negative (–ve) data comparator 54 (typically implemented as an inverting comparator) receives, as a first input, the waveform profile x from first output terminal 122. A second (differential) input to the negative data comparator 54 is provided from modification of the waveform profile x by a series combination of the 620 Ω common input resistor 128 and a second diode 146. The cathode of the second diode 146 is connected to the common input resistor 128, while its anode is coupled to the second input of the negative data comparator 54. The cathode of the second diode 146 is therefore coupled to the anode of the first diode 130, while the second output terminal 123 (of the transformer 44) is coupled through the third resistor 142 to the second (differential) input of the negative data comparator 54. A second capacitor 148, of capacitance 0.1 µF and located between the anode of the second diode 146 and the second input of the negative data comparator 54, is coupled to the ground plane 126.

The first diode 130 and the second diode 146 may be 1N4148 diodes.

The combination of the first diode 130 and the first capacitor 132 form a first diode pump 134 that acts as a first averaging circuit (or integrator) for the waveform profile x. Similarly, the combination of the second diode 146 and the second capacitor 148 form a second diode pump 150 that acts as a second averaging circuit (or integrator) for the waveform profile x (but for the negative portion of the bipolar input signal 42).

Point x connects the inputs to each comparator 52–54; it provides direct current (dc) bias to them from circuit node 136 to ensure that, in the absence of any input signal, the comparators are switched-off. Conversely, when a received signal (or pulse) is present, the voltage at point x moves relative to the voltage level at circuit node 136, and hence the presence of a relative high or relatively low voltage may trigger comparator output.

The voltage formed by the series combination of the first resistor 138, the second resistor 140, the third resistor 142 and the fourth resistor 144 form a biasing chain that acts to bias the second (differential) inputs to the respective positive data (+ve) comparator 52 and negative (–ve) data comparator 54. The voltages applied to the second (differential) inputs are dynamically altered as a consequence of the ratio between the biasing chain and the common input resistor 128, which ratio therefore determines the reference level used to assign logical levels to reconstruct the original (ideal) 3-level signal. Hence, a bipolar input signal 42 that is subjected to the circuitry between lines E—E and F—F will be presented to the differential inputs of the respective positive data (+ve) comparator 52 and negative (–ve) data comparator 54 as a dynamically varying signal having an amplitude set by the ratio of the biasing chain to the common input resistor 128. The positive 52 and negative 54 data comparators then generate a binary output based on a comparison of their respective first and second (differential) inputs. In other words, levels of v and w (of FIG. 4) will be presented at the differential inputs of the respective positive data (+ve) comparator 52 and negative (–ve) data comparator 54, while waveform x is applied to the respective first inputs.

As will be appreciated, the ratio between the biasing chain and the common input resistor 128 acts as a voltage divider circuit. Other networks or structures that provide this voltage dividing function (for use by the pump diodes 130, 146) could therefore be implemented in place of the resistive networks of the preferred embodiment, with such substitutions being readily known to the skilled addressee and therefore within the scope of the present invention.

For a binary (2-level) signal, the circuitry associated with the second diode pump 150, the second negative data comparator 54 and the third resistor 142 could be eliminated, although grounding of the circuit node 136 through an appropriate resistor would still be required.

The level detectors (i.e. the positive and negative data comparators 52–54) may operate to average the varying voltage of the input waveform over a period of a symbol to arrive at a mean voltage level for that symbol. In this way, spurious reports arising from interference, e.g. noise spikes, are disregarded. Alternatively, the level detectors may operate to produce an output entirely based on an instantaneous and absolute level of amplitudes of the respective input waveform (i.e. the bipolar input signal 42) and the reference threshold level. In the case of the integrators (i.e. the first and second diode pumps, or their functional equivalent), the voltage level of the bipolar input signal 42 is, in fact, weighted (averaged) by the biasing chain for subsequent use as the reference threshold level at the second (differential) input to the data comparators. The bipolar input signal 42 is then compared against the reference threshold level to determine an actual logical value of the symbol.

Returning to the remaining circuit description of FIG. 7, respective outputs (conventionally termed T+ and T– pulses) from the positive and negative data comparators 52–54 are applied both to a (digital) phase lock loop 154 (PLL) and individually to respective inputs of associated D-type flip-flops (or other similar storage devices) 66–68. The PLL 154 extracts a suitable clock signal from the incoming pulse stream of T+ and T– pulses, and then generates an appropriate delay to allow the T+ and T– pulses can be clocked into the D-type flip flops 66–68 at the appropriate instant. As such, clock inputs of the D-type flip flops 66–68 are responsive to the PLL 154. An output 70 can then be read from the relevant D-type flip-flops 66–68 at the relevant time.

Although a digital PLL is proposed as an appropriate method for clock extraction, a 'tank-circuit' is a well-established alternative that could instead be used.

In summary, the preferred embodiment of the present invention operates by applying each positive and negative received pulse into two data comparators (level detectors) whose differential input (or threshold) level automatically varies according to the level of the received input signals. This is achieved through the use, principally, of passive circuit components. More particularly, the first and second diode pumps ensure that each comparator threshold level is automatically adjusted to be at a pre-selected level of each received pulse, typically towards the centre of each eye-shaped pulse, regardless of input level. The preferred embodiment of the present invention therefore automatically adjusts the differential levels of the level detectors based on the level of the input signal.

The preferred embodiment of the present invention could be implemented as a passive front end (containing the discrete resistors, capacitors and diodes) and a single LSI package having data comparators 52–54, the digital PLL 154 and flip-flops 66–68. Typically, the discrete components will be surface mounted.

The preferred embodiment of the present invention has been found to operate accurately over an attenuation range of 0–6 dB, which range is typically provided in a cable connection having an approximate square-root frequency response.

The present invention provides a significant reduction in the cost and size associated with implementing a receive interface because the complexity of the LSI is reduced as a result of the ability to use passive front-end components. Consequently, the receive interface also consumes less power and therefore generates less heat. Particularly, the present invention provides a dynamic threshold setting circuit that is driven by the input signal, rather than the prior art mechanism in which an input signal is intelligently amplified in proportion to the operating voltage of the positive and negative data comparators. The present invention therefore ensures that decisions concerning the encoded logical levels (in the received signal) are optimised, and that interference protection is always maximised.

It will, of course, be appreciated that the above description has been given by way of example only and that modifications in detail may be made within the scope of the invention. For example, the invention is not limited to use with a bipolar (3-level) signal since any number of appropriately biased averaging circuits may be used to provide a reference level. Specifically, to implement 140 Mbps and 155 Mbps interfaces in which the line code is binary rather than bipolar, only half the circuitry would be required because there are only two levels to detect. Additionally, as will be appreciated, the ratio between the common input resistor 128 and the bias chain may be varied to take into account differing input waveforms (i.e. the differing shapes of input pulses) or input voltage levels, whereby the reference level can be weighted within the eyelet of the input waveform to maximise noise immunity and therefore to optimise data recovery, i.e., the reference level need not be set to 46% of the datum-to-peak input voltage and so could take other values, e.g. 50%.

Clearly, the present invention is generally applicable to receive interfaces and particularly to all interfaces within the CCITT G703 interface recommendation, with minor circuit changes (evident to the skilled addressee) required with respect to component values or component types. For example, the present invention could be modified to support a 34 Mbps (which operates on a 1 V peak instead of 2.37 V peak) by replacing the standard silicon diodes by Schottky diodes having a lower voltage drop, or alternatively by providing a step up transformer to compensate for the lower voltage of the input signal. Indeed, the present invention would be suitable for implementation with the data rates of 64 kbps to 100 Mbps, and could be applied to multi-level signals coded with AMI, HDB3, B6ZS, B3ZS and CMI codes, for example.

I claim:

1. A level detector circuit arranged to assign into logical levels a multi-level signal having varying amplitudes, the level detector circuit comprising:
   a) a comparator having:
      a first input responsive to the multi-level signal;
      a second input arranged to receive a reference level threshold having a reference amplitude; and
      an output, responsive to said first input and said second input, for providing the logical levels based upon relative amplitudes between the multi-level signal and the reference level threshold; and
   b) a control circuit responsive to the multi-level signal and having an output arranged to generate the reference level threshold, the control circuit having means for dynamically varying said reference amplitude of the reference level threshold in proportion to the amplitude of the multi-level signal.

2. The level detector circuit of claim 1, wherein the means for dynamically varying said reference amplitude of the reference level threshold comprises:
   a) an integrator, responsive to the multi-level signals, arranged to provide the reference level threshold; and
   b) a voltage divider network, coupled to the integrator, for weighting said reference amplitude of the reference level threshold in proportion to an amplitude of the multi-level signals.

3. The level detector circuit of claim 2, wherein the voltage divider network comprises a biasing chain having:
   a) a first resistive network having a first resistance; and
   b) a second resistive network having a second resistance;
   wherein weighting of said reference amplitude of the reference level threshold is based upon a ratio between said second resistance and said first resistance.

4. The level detector circuit of claim 2, wherein the integrator is a charge pump comprising a diode-capacitor combination.

5. The level detector circuit of claim 1, wherein the multi-level signal is a bipolar signal.

6. The level detector circuit of claim 5, wherein the bipolar signal has a frequency in the approximate range of 2 Mbps to 64 Mbps.

7. The level detector circuit of claim 3, wherein the level detector is for a receive interface of a communication device.

8. An interface for a communication device responsive to an attenuated bipolar signal having symbols represented by information bits of varying amplitudes, the interface comprising a plurality of level detector circuits arranged to assign the bipolar signal into logical levels, each one of the plurality of level detector circuits having:
   a) a comparator having:
      a first input responsive to the bipolar signal;
      a second input arranged to receive a reference level threshold having a reference amplitude; and
      an output, responsive to said first input and said second input, for providing the logical levels for the symbols based upon relative amplitudes between the bipolar signal and the reference level threshold; and
   b) a control circuit responsive to the bipolar signal and having an output arranged to generate the reference level threshold, the control circuit having means for dynamically varying said reference amplitude of the reference level threshold in proportion to the amplitude of the bipolar signal.

9. The interface of claim 8, wherein each one of the plurality of level detector circuits further comprises:
   a) an integrator, responsive to the bipolar signals, arranged to provide the reference level threshold; and
   b) a voltage divider network, coupled to the integrator, for weighting said reference amplitude of the reference level threshold in proportion to an amplitude of the bipolar signals, the voltage divider network comprises a biasing chain having:
      a first resistive network having a first resistance; and
      a second resistive network having a second resistance;
   wherein weighting of said reference amplitude of the reference level threshold is based upon a ratio between said second resistance and said first resistance.

10. The interface of claim 9, wherein the second resistive network is common to each of the plurality of level detector circuits.

11. A method of adjusting a logical output of a level detector circuit arranged to assign into logical levels a multi-level signal having varying amplitudes, the level detector circuit comprising a comparator having a first input, a second input and an output, the level detector circuit further comprising a control circuit responsive to the multi-level signal and having an output arranged to generate a reference level threshold having a reference amplitude, the method comprising the steps of:

a) applying the multi-level signal to the first input;

b) applying the reference level threshold to the second input;

c) generating logical levels at the output based upon relative amplitudes between the multi-level signal applied to the first input and the reference amplitude; and d) dynamically varying said reference amplitude of the reference level threshold in proportion to the amplitude of the multi-level signal applied to the first input.

12. The method of claim 11, wherein the step of dynamically varying said reference amplitude further includes the steps of:

a) integrating the multi-level signals to provide an integrated signal; and b) weighting said integrated signal to adjust the reference amplitude of the reference level threshold in proportion to the amplitude of the multi-level signals.

* * * * *